(12) United States Patent
Ng et al.

(10) Patent No.: US 10,136,568 B2
(45) Date of Patent: Nov. 20, 2018

(54) CARRIER TAPE AND CARRIER TAPE ASSEMBLY

(71) Applicant: 3M INNOVATIVE PROPERTIES COMPANY, St. Paul, MN (US)

(72) Inventors: Chee Ming Ng, Singapore (SG); Kam Poi Chia, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/519,655

(22) PCT Filed: Oct. 19, 2015

(86) PCT No.: PCT/US2015/056216
§ 371 (c)(1),
(2) Date: Apr. 17, 2017

(87) PCT Pub. No.: WO2016/069307
PCT Pub. Date: May 6, 2016

(65) Prior Publication Data
US 2017/0257990 A1 Sep. 7, 2017

Related U.S. Application Data

(60) Provisional application No. 62/072,066, filed on Oct. 29, 2014.

(51) Int. Cl.
*B65D 75/30* (2006.01)
*H05K 13/00* (2006.01)
(Continued)

(52) U.S. Cl.
CPC ......... *H05K 13/0084* (2013.01); *B65D 73/02* (2013.01); *H05K 13/0417* (2013.01)

(58) Field of Classification Search
CPC ...... B65D 73/02; B65D 75/30; B65D 75/323; B65D 75/327
(Continued)

(56) References Cited

U.S. PATENT DOCUMENTS 5,234,104 A 8/1993 Schulte
5,499,717 A 3/1996 Hayashi
(Continued)

FOREIGN PATENT DOCUMENTS

JP H11-157574 6/1999
JP 2002-225926 8/2002
(Continued)

OTHER PUBLICATIONS

International Search Report for PCT International Application No. PCT/US2015/056216, dated Jan. 28, 2016, 3pgs.

*Primary Examiner* — King M Chu
(74) *Attorney, Agent, or Firm* — Jonathan L. Tolstedt

(57) ABSTRACT

A carrier tape includes a longitudinally extending central portion having pockets formed therein. Each pocket respectively comprises a plurality of sidewalls and a bottom. First and second side portions are disposed adjacent to opposite sides of the central portion and extend longitudinally therewith. Each of the first and second side portions includes a respective adhesion zone that is spaced apart from the central portion. Discontinuous raised features disposed between and contacting adjacent pockets. The raised features each respectively extend between the first and second side portions and include a transverse raised platform terminated at opposite ends by first and second longitudinal ribs that are integrally formed with the raised platform. Adjacent pairs of adjacent raised features are separated from one another by first and second collinear transverse channels. A carrier tape assembly included the carrier tape, a cover film, and electronic components disposed in the pockets of the carrier tape.

6 Claims, 3 Drawing Sheets

(51) Int. Cl.
*B65D 73/02* (2006.01)
*H05K 13/04* (2006.01)

(58) Field of Classification Search
USPC ........................................ 206/714, 713, 717
See application file for complete search history.

(56) References Cited

U.S. PATENT DOCUMENTS

| | | |
|---|---|---|
| 2002/0005371 A1 | 1/2002 | Susaki |
| 2003/0019784 A1 | 1/2003 | Pylant |
| 2004/0011700 A1* | 1/2004 | Brahmbhatt ....... H05K 13/0084 206/713 |
| 2007/0074996 A1* | 4/2007 | Nice .................. H05K 13/0084 206/714 |
| 2009/0114564 A1 | 5/2009 | Huang |
| 2009/0145543 A1 | 6/2009 | Velasquez Urey |
| 2014/0166534 A1 | 6/2014 | Mori |
| 2014/0170414 A1 | 6/2014 | Zhang |

FOREIGN PATENT DOCUMENTS

| | | |
|---|---|---|
| KR | 10-1999-0033101 | 5/1999 |
| KR | 20-2011-0010496 | 11/2011 |
| WO | WO 2013-090062 | 6/2013 |

\* cited by examiner
CARRIER TAPE AND CARRIER TAPE ASSEMBLY

FIELD

The present disclosure broadly relates to carrier tapes useful for electronic component packaging applications.

BACKGROUND

As electronic equipment is miniaturized, the storage, handling, and transport of electronic components become more important. Generally, the electronic components are transported to an assembly location in a carrier tape assembly that has a plurality of pockets formed therein to hold the electronic components. The carrier tape assembly includes a carrier tape and a cover tape or film. Carrier tapes are often manufactured in a thermoforming or embossing operation in which a web of thermoplastic polymer is delivered to a mold that forms the component pockets in the carrier tape. A cover film can be heat sealed continuously along the edges of the carrier tape to seal the electronic components within the pockets of the carrier tape.

The electronic components are mounted onto a printed circuit board (PCB) or other substrate during assembly of electronic equipment or sub-assemblies that will be used later to build electronic equipment. The cover film is removed from the carrier tape during this assembly process to expose the electronic components residing within the pockets of the carrier tape. The component is typically lifted from a pocket by automatic precision placement machines and mounted to the PCB or substrate being assembled.

However, as semiconductor or other electronic components become smaller and thinner, the electronic components can migrate out of the pocket during shipping and handling, especially when traveling through pick and place machines.

SUMMARY

In one aspect, the present disclosure provides a carrier tape having pockets for carrying electronic components, the carrier tape comprising:

a longitudinally extending central portion having a plurality of pockets formed therein, wherein the plurality of pockets comprises first, second, and third pockets;

first and second side portions disposed adjacent to opposite sides of the central portion and extending longitudinally therewith, wherein each of first and second side portions includes a respective adhesion zone that is spaced apart from the central portion; and discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions.

A component carrier tape assembly comprising:

a carrier tape having pockets for carrying electronic components, the carrier tape comprising:

a longitudinally extending central portion having a plurality of pockets formed therein, wherein the plurality of pockets comprises first, second, and third pockets;

first and second side portions are disposed adjacent opposite sides central portion and extending longitudinally therewith, wherein each of first and second side portions includes a respective adhesion zone that is spaced apart from the central portion; and discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions;

at least one electronic component disposed within at least one of the pockets; and a cover tape adhered to the respective adhesion zones of the first and second side portions, wherein the cover tape seals the at least one electronic component within a respective cavity of the carrier tape.

As used herein, the term "elevation" refers to elevation when the carrier tape (or carrier component tape) is laid horizontally with the pocket openings oriented toward the upper surface (i.e., facing up). Similarly, the terms "up", "down", "vertical", and "horizontal" are based on the carrier tape having this orientation.

Features and advantages of the present disclosure will be further understood upon consideration of the detailed description as well as the appended claims.

Figure 1:
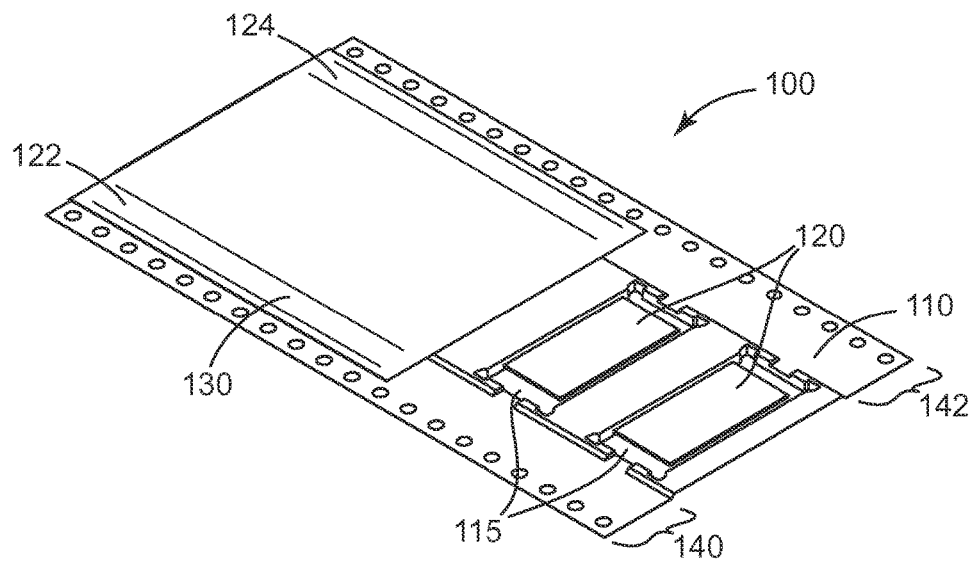
FIG. 1 is a schematic perspective view of a carrier tape assembly 100 according to the present disclosure.

Repeated use of reference characters in the specification and drawings is intended to represent the same or analogous features or elements of the disclosure. It should be understood that numerous other modifications and embodiments can be devised by those skilled in the art, which fall within the scope and spirit of the principles of the disclosure. The figures may not be drawn to scale.

DETAILED DESCRIPTION

Carrier tapes according to the present disclosure are generally used in combination with electronic components and a cover tape. Referring now to FIG. 1, exemplary carrier tape assembly 100 comprises carrier tape 110, cover film 130 and electronic components 120 disposed within pockets 115 of carrier tape 110. In typical use, the carrier tape assembly is fed into a pick and place apparatus that peels back the cover tape, picks up an electronic component, and places it on an electronic assembly circuit board. As the carrier tape assembly is fed through the apparatus it is flexed up and down, much like film passing through a motion picture projector. Stresses that build up in the carrier tape during such flexing can result in individual electronic components becoming dislodged from the cavities in which they reside and caught between the cover tape and the carrier tape (particularly during upward flexing), which cause problems with the precise positioning required to pick up the electronic part. Advantageously, channels in carrier tapes according to the present disclosure relieve some of the upward flexing stress and effectively maintain the desired position of electronic components within the cavities of the carrier tape.

Figure 2:
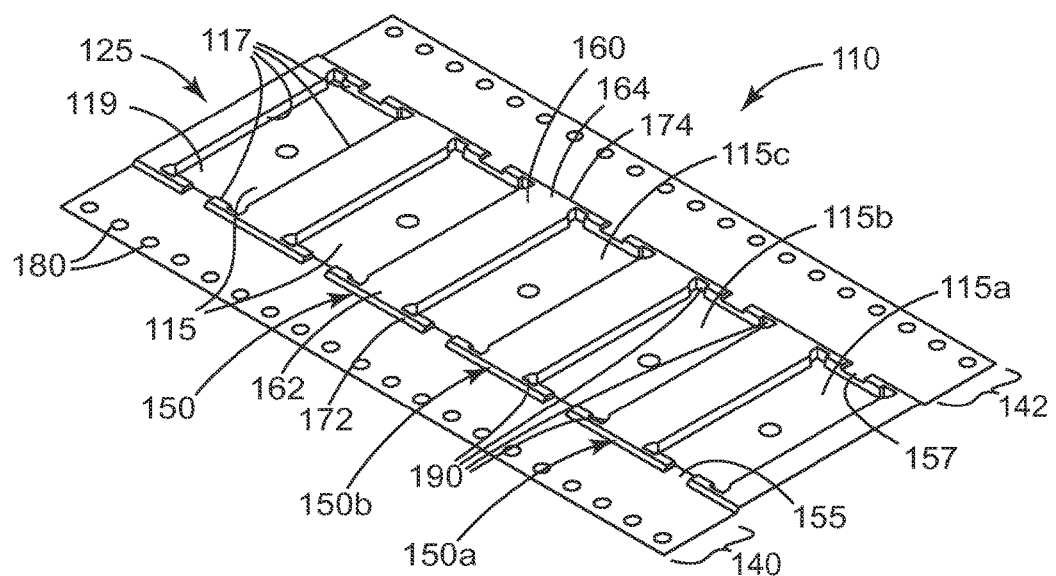
FIG. 2 is a schematic perspective view of carrier tape 110 shown in FIG. 1.
Figure 3A:
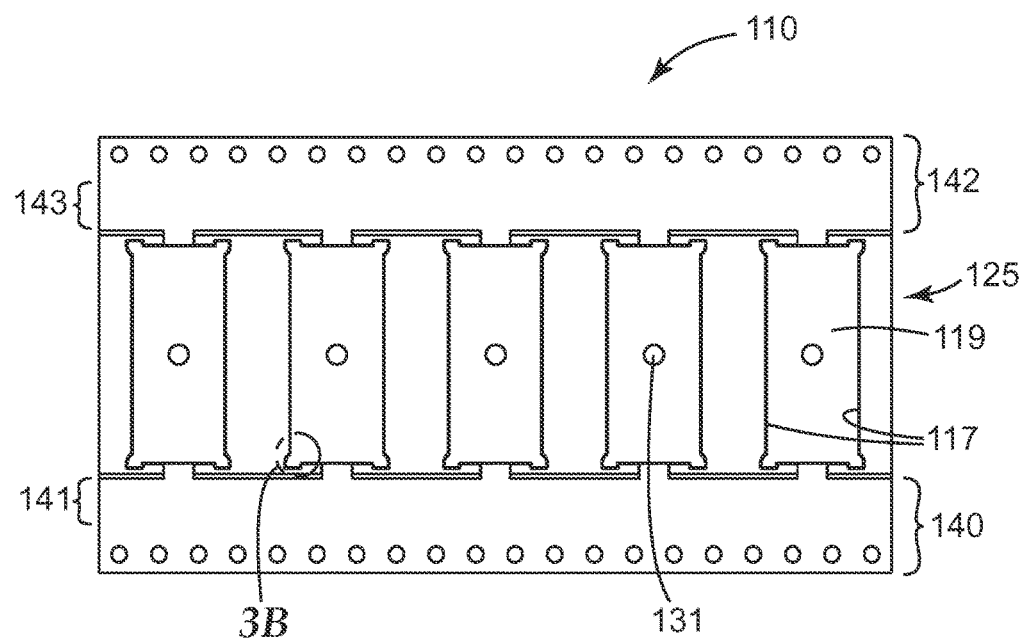
FIG. 3A is a schematic top view of carrier tape 110 shown in FIG. 2.

Referring now to FIGS. 2 and 3A, carrier tape 110 comprises a longitudinally extending central portion 125 having a plurality of pockets 115 formed therein for carrying electronic components, wherein the plurality pockets comprises first, second, and third pockets (115a, 115b, 115c). The pockets are generally rectangular; however, it is contemplated that other pocket shapes (simple or complex) may also be used as long as they are capable of retaining the desired electrical component. Each pocket 115 comprises sidewalls 117, bottom surface 119, and corner recesses 190. Preferably, sidewalls 117 and bottom surface 119 are substantially planar although this is not a requirement. For example, in some embodiments it may be desirable that bottom surface 119 include a central raised pedestal (e.g., a cylinder or truncated pyramid). In some preferred embodiments, bottom surface 119 of each of the pockets is horizontally oriented. Preferably, sidewalls 117 taper inwardly going from the top to bottom surface 119 of respective pockets 115. In some embodiments, at least some of the sidewalls 117 are vertical.

In general, pockets 115 are designed to accommodate the size and shape of the electronic components that they are intended to receive. Although not specifically illustrated, the pockets may have more or less side walls than the four that are shown in FIG. 2. Thus, the pockets may be circular, oval, triangular, pentagonal, or have other shapes in outline. Each sidewall may also be formed with a slight draft (i.e., a 2° to 12° slant toward or away from the center of the pocket) in order to facilitate insertion of the component, and to assist in releasing the pocket from a mold or forming die during fabrication of the carrier tape. The depth of the pocket can also vary depending on the component that the pocket is intended to receive. In addition, the interior of the pocket may be formed with ledges, ribs, pedestals, bars, tabs, and other similar structural features to better accommodate or support a particular type of electronic components. Although a single row of pockets is illustrated in the drawings, two or more rows of aligned pockets could also be formed along the length of the elevated central portion in order to facilitate the simultaneous delivery of multiple electronic components.

As shown in FIG. 3A, bottom surfaces 119 can include optional vacuum holes 131 which is used in applying a vacuum to the pocket to permit more efficient loading of the pockets with the electronic components. In addition, the vacuum holes can also be used for visual inspection to confirm that the electronic of component is present in the pocket.

Figure 3B:
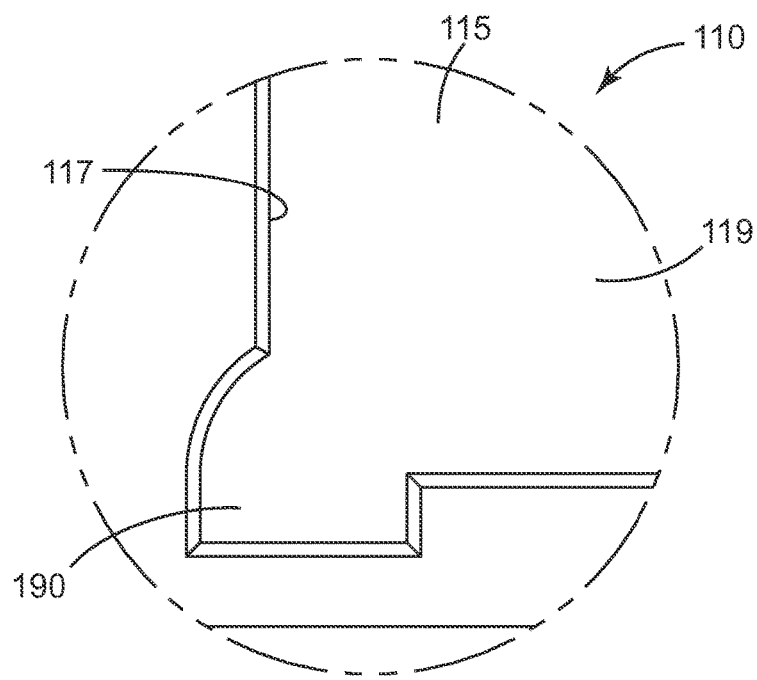
FIG. 3B is an enlarged top view of region in FIG. 3A.

Referring now to FIG. 3B, corner recesses 190 are disposed at corners of pockets 115. Corner recesses 190 provide recesses that serve to further protect fragile corners of thin electrical components by eliminating contact of the corners with the pocket walls. While corner recesses 190 are preferred, they are not required, and they may be replaced, for example, by rectangular corners formed by joining adjacent sidewalls, if desired.

Referring again for FIGS. 1, 2, and 3A, first and second side portions 140, 142 are disposed adjacent opposite sides of central portion 125 and extend longitudinally therewith. Each of first and second side portions 140, 142 includes a respective adhesion zone 141, 143 that is spaced apart from central portion 125.

Referring again to FIG. 1, carrier tape assembly 100 typically further includes an elongate cover film 130 applied over the pockets 115 of carrier tape 110 to retain electronic components 120 therein. As illustrated, cover film 130 includes parallel longitudinal bonding portions 122, 124 that are bonded to top surface of side portions 140, 142, respectively, of the carrier tape. For example, a pressure-sensitive adhesive such as an acrylate material, or a heat-activated adhesive such as an ethylene-vinyl acetate copolymer, can be used to adhere the cover film to top surface of side portions 140, 142.

Cover film 130 can be continuously adhered to the carrier tape within the adhesion zones along the longitudinal length of the carrier tape. In an exemplary embodiment, the width of the bond area between the cover film and the carrier tape on both side portions are of the same width. Having two continuous bond areas allows for a stable and even separation of the cover film from the carrier tape during electronic equipment assembly operations. In addition, having the adhesion zones spaced apart from the elevated central portion and the pockets formed therein helps to minimize contamination of the electronic devices house within the pockets when the cover film is removed from the carrier tape. Cover film 130 can include an adhesive layer such as a pressure-sensitive adhesive such as an acrylate based adhesive strip coated onto a backing layer, or a heat-activated adhesive such as an ethylene-vinyl acetate copolymer coated on a support layer. The adhesive layer can be used to adhere the cover film to top surface of side portions 140, 142 of carrier tape 110. In one exemplary aspect, the cover film can be a heat-sealable cover film as described in U.S. Pat. Appln. Publ. No. 2014/0170414 (Zhang et al.). In an alternative embodiment, the cover film can have a pair of adhesive strips disposed along the longitudinal edges of the cover film as described in U.S. Pat. Appl. Publ. No. 2009/0145543 (Velasquez).

Referring again to FIG. 2, discontinuous raised features 150 are disposed between and contact adjacent pockets 115. For example, raised feature 150a is disposed between and contacts pockets 115a, 115b, and likewise raised feature 150b is disposed between and contacts pockets 115b, 115c. Raised features 150 each extend between first and second side portions 140, 142. Raised features 150 each include a respective transverse raised platform 160 that is terminated at opposite ends 162, 164 by first and second longitudinal (i.e., longitudinally oriented) ribs 172, 174 that are integrally formed with raised platform 160. Pairs of adjacent raised features 150 are separated from one another by first and second collinear transverse channels 155, 157. For example, raised features 150a, 150b are separated by collinear transverse channels 155a, 157a. First and second transverse channels 155, 157 have the same elevation as first and second side portions 140, 142.

Optional sprocket holes 180 facilitate mechanical handling of the carrier tape and/or carrier tape assembly. In some embodiments, other advancement structures (e.g., notches or printed indicia) may be used in place of, or in addition to, sprocket holes 180. The advancement structures (including sprocket holes) may be disposed, for example, along one or both longitudinal edges of the carrier tape. The advancement structures can engage with teeth on a sprocketed drive (not shown) as may be present in the drive assemblies of the precision placement equipment used to remove the electronic components from the pockets of the carrier tape. The advancement structures are used to advance the carrier tape to a prescribed location such that the electronic component can be placed in or removed from the pocket of the carrier tape.

Figure 4:
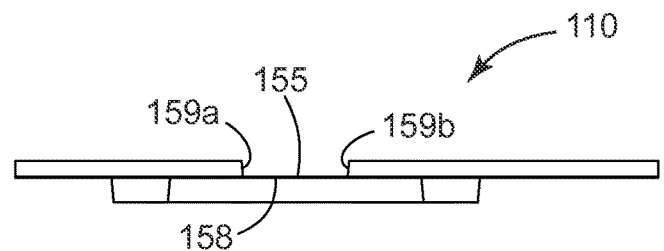
FIG. 4 is a schematic cutaway side view of carrier tape 110 showing a pocket 115.

Referring now to FIG. 4, transverse channel 155 has sloping sidewalls 159a, 159b and a flat channel bottom 158. While sloping channel sidewalls are depicted in FIG. 4, it is envisaged that vertical sidewalls may also be used. Furthermore, is contemplated that the channels may be v-grooves formed from two sloping channel sidewalls with no bottom surface at all.

Figure 5A:
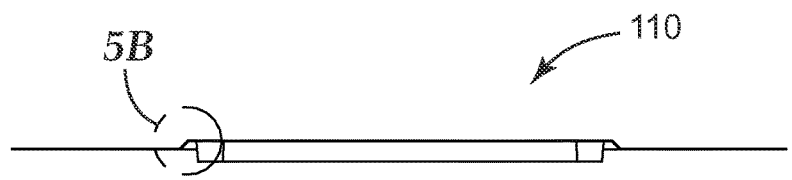
FIG. 5A is a schematic end view of carrier tape 110.
Figure 5B:
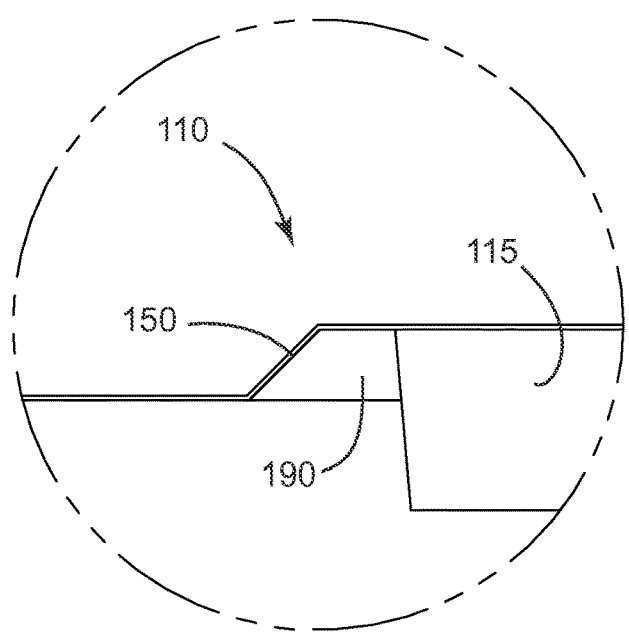
FIG. 5B is an enlarged view of region 5B shown in FIG. 5A.

For further understanding, FIGS. 5A and 5B show end views of carrier tape 110.

Carrier tapes and cover tapes used in practice of the present disclosure may be made of any suitable material including, for example, thermoplastic polymeric materials, cardboard, and/or metal foil. In addition, the materials that can be used for component carrier tapes should be dimensionally stable, durable, and readily formable into the desired configuration. Preferably, the material comprises a thermoplastic polymeric material that has a sufficient thickness and flexibility to permit it to be wound about the hub of a storage reel. Suitable thermoplastic polymeric materials include, but are not limited to, polyesters (e.g., glycol-modified polyethylene terephthalate, or polybutylene terephthalate), polycarbonate, polypropylene, polystyrene, polyvinyl chloride, acrylonitrile-butadiene-styrene, amorphous polyethylene terephthalate, polyamide, polyolefins (e.g., polyethylene, polybutene, or polyisobutene), modified poly(phenylene ether), polyurethane, polydimethylsiloxane, acrylonitrile-butadiene-styrene resins, and polyolefin copolymers. In some embodiments, the material has a melt temperature in the range of 400° F. (204° C.) to 630° F. (332° C.). The carrier tape may be optically clear, pigmented or modified to be electrically dissipative. In the latter case, the carrier tape may include an electrically conductive material, such as carbon black or vanadium pentoxide, either dispersed within the resin material or coated onto the surface(s) of the formed carrier tape. The electrically conductive material helps dissipate an electric discharges that can occur during removal of the cover film or unwinding of the carrier tape assembly from a storage spool thus helping to prevent damage to the electronic components contained within the pockets of the carrier tape. In addition dyes, colorants, pigments, UV stabilizers, or other additives may be added to the resin material before forming the carrier tape.

Carrier tapes according to the present disclosure may have any dimensions suitable for use with particular desired electronic components. For example, the pockets may be spaced apart on 1.6 cm centers.

SELECT EMBODIMENTS OF THE PRESENT DISCLOSURE

In a first embodiment, the present disclosure provides a carrier tape having pockets for carrying electronic components, the carrier tape comprising:

a longitudinally extending central portion having a plurality of pockets formed therein, wherein the plurality of pockets comprises first, second, and third pockets, and wherein each pocket respectively comprises a plurality of sidewalls and a bottom;

first and second side portions disposed adjacent to opposite sides of the central portion and extending longitudinally therewith, wherein each of first and second side portions includes a respective adhesion zone that is spaced apart from the central portion; and discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions.

In a second embodiment, the present disclosure provides a carrier tape according to the first embodiment, wherein the first and second channels have sloping channel walls separated by a flat channel bottom.

In a third embodiment, the present disclosure provides a carrier tape according to the first or second embodiment, wherein each pocket respectively further comprises corner recesses disposed between adjacent sidewalls.

In a fourth embodiment, the present disclosure provides a carrier tape assembly comprising:

a carrier tape having pockets for carrying electronic components, the carrier tape comprising:
- a longitudinally extending central portion having a plurality of pockets formed therein, wherein the plurality of pockets comprises first, second, and third pockets;
- first and second side portions disposed adjacent to opposite sides of the central portion and extending longitudinally therewith, wherein each of first and second side portions includes a respective adhesion zone that is spaced apart from the central portion; and
- discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions;

at least one electronic component disposed within at least one of the pockets; and a cover tape adhered to the respective adhesion zones of the first and second side portions, wherein the cover tape seals the at least one electronic component within a respective cavity of the carrier tape.

In a fifth embodiment, the present disclosure provides a carrier tape assembly according to the fourth embodiment, wherein the first and second channels have sloping channel walls separated by a flat channel bottom.

In a sixth embodiment, the present disclosure provides a carrier tape assembly according to the fourth or fifth embodiment, wherein each pocket respectively further comprises corner recesses disposed between adjacent sidewalls.

Objects and advantages of this disclosure are further illustrated by the following non-limiting examples, but the particular materials and amounts thereof recited in these examples, as well as other conditions and details, should not be construed to unduly limit this disclosure.

All cited references, patents, and patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A carrier tape having pockets for carrying electronic components, the carrier tape comprising:
    a longitudinally extending central portion having a plurality of pockets formed therein, wherein the plurality of pockets comprises first, second, and third pockets, and wherein each pocket respectively comprises a plurality of sidewalls and a bottom;
    first and second side portions disposed adjacent to opposite sides of the central portion and extending longitudinally therewith, wherein each of first and second side portions includes a respective adhesion zone that is spaced apart from the central portion; and
    discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions.

2. The carrier tape of claim 1, wherein the first and second channels have sloping channel walls separated by a flat channel bottom.

3. The carrier tape of claim 1, wherein each pocket respectively further comprises corner recesses disposed between adjacent sidewalls.

4. A carrier tape assembly comprising:
    a carrier tape having pockets for carrying electronic components, the carrier tape comprising:
        a longitudinally extending central portion having a plurality of pockets formed therein, wherein the plurality of pockets comprises first, second, and third pockets;
        first and second side portions disposed adjacent to opposite sides of the central portion and extending longitudinally therewith, wherein each of first and second side portions includes a respective adhesion zone that is spaced apart from the central portion; and
        discontinuous raised features disposed between and contacting adjacent pockets, wherein the raised features each respectively extend between the first and second side portions, wherein the raised features include a transverse raised platform terminated at opposite ends by first and second longitudinal ribs that are integrally formed with the raised platform, and wherein pairs of adjacent raised features are separated from one another by first and second collinear transverse channels, wherein the first and second transverse channels have the same elevation as the first and second side portions;
    at least one electronic component disposed within at least one of the pockets; and
    a cover tape adhered to the respective adhesion zones of the first and second side portions, wherein the cover tape seals the at least one electronic component within a respective cavity of the carrier tape.

5. The carrier tape assembly of claim 4, wherein the first and second channels have sloping channel walls separated by a flat channel bottom.

6. The carrier tape assembly of claim 4, wherein each pocket respectively further comprises corner recesses disposed between adjacent sidewalls.

* * * * *